United States Patent
Furuyama et al.

(10) Patent No.: US 9,636,616 B2
(45) Date of Patent: *May 2, 2017

(54) WATER-PROOF AIR-PERMEABLE FILTER AND USE OF THE SAME

(71) Applicant: NITTO DENKO CORPORATION, Ibaraki-shi, Osaka (JP)

(72) Inventors: Satoru Furuyama, Osaka (JP); Yozo Nagai, Osaka (JP); Junichi Moriyama, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/638,659

(22) Filed: Mar. 4, 2015

(65) Prior Publication Data

US 2015/0174517 A1   Jun. 25, 2015

Related U.S. Application Data

(63) Continuation of application No. 13/702,833, filed as application No. PCT/JP2011/001698 on Mar. 23, 2011, now Pat. No. 9,005,334.

(30) Foreign Application Priority Data

Jun. 16, 2010   (JP) .................. 2010-136828

(51) Int. Cl.
*B01D 53/22*   (2006.01)
*B01D 46/00*   (2006.01)
(Continued)

(52) U.S. Cl.
CPC ......... *B01D 46/0023* (2013.01); *B01D 39/16* (2013.01); *B01D 39/1692* (2013.01);
(Continued)

(58) Field of Classification Search
CPC .... B01D 53/22; B01D 46/0023; B01D 39/16; B01D 39/1692; B01D 46/54;
(Continued)

(56) References Cited

U.S. PATENT DOCUMENTS 4,161,948 A   7/1979   Bichon
4,459,139 A   7/1984   vonReis et al.
(Continued)

FOREIGN PATENT DOCUMENTS

DE   19536033   4/1997
EP   2219387   8/2010
(Continued)

OTHER PUBLICATIONS

"Standard deviation" 1 pg, American Heritage Dictionary of the English Language, Fifth Edition. 2011 by Houghton Mifflin Harcourt Publishing Company.*
(Continued)

*Primary Examiner* — Anthony Shumate
(74) *Attorney, Agent, or Firm* — Hamre, Schumann, Mueller & Larson, P.C.

(57) ABSTRACT

A water-proof air-permeable filter (1) includes: a resin film (2) having formed therein a plurality of through pores (21); and a treated layer (3) having hydrophobicity and oil repellency, and formed on at least one of both surfaces in the thickness direction of the resin film (2) such that the treated layer (3) has openings (31) at positions corresponding to the through pores (21). The through pores (21) each have a predetermined size larger than or equal to 0.01 μm and smaller than or equal to 10 μm, and are uniformly distributed such that a density of the through pores falls within specific limits included in a range from 10 to $1 \times 10^8$ pores/mm$^2$.

19 Claims, 1 Drawing Sheet

(51) Int. Cl.
| | | |
|---|---|---|
| *B01D 46/54* | (2006.01) | |
| *B01D 69/02* | (2006.01) | |
| *B32B 3/26* | (2006.01) | |
| *H05K 5/06* | (2006.01) | |
| *B01D 39/16* | (2006.01) | |
| *B01D 71/48* | (2006.01) | |
| *B32B 5/32* | (2006.01) | |
| *H05K 7/20* | (2006.01) | |
| *B01D 67/00* | (2006.01) | |

(52) U.S. Cl.
CPC .......... *B01D 46/54* (2013.01); *B01D 53/228* (2013.01); *B01D 67/0088* (2013.01); *B01D 69/02* (2013.01); *B01D 71/48* (2013.01); *B32B 3/266* (2013.01); *B32B 5/32* (2013.01); *H05K 5/068* (2013.01); *H05K 7/20* (2013.01); *B01D 2239/0428* (2013.01); *B01D 2239/1216* (2013.01); *B01D 2279/35* (2013.01); *B01D 2279/45* (2013.01); *B01D 2323/04* (2013.01); *B01D 2325/02* (2013.01); *B01D 2325/04* (2013.01); *B01D 2325/38* (2013.01); *B32B 2307/724* (2013.01); *B32B 2307/7265* (2013.01)

(58) Field of Classification Search
CPC .. B01D 53/228; B01D 67/0088; B01D 69/02; B01D 71/48; B01D 2239/0428; B01D 2239/1216; B01D 2279/35; B01D 2279/45; B01D 2323/45; B01D 2323/04; B01D 2325/02; B01D 2325/04; B01D 2325/38; B32B 3/266; B32B 5/32; B32B 2307/724; B32B 2307/7265; H05K 5/068; H05K 7/20
See application file for complete search history.

(56) References Cited

U.S. PATENT DOCUMENTS

| | | | |
|---|---|---|---|
| 4,521,212 A | 6/1985 | Ruschke | |
| 4,968,464 A | 11/1990 | Kojoh et al. | |
| 5,069,794 A | 12/1991 | Haag et al. | |
| 5,100,555 A | 3/1992 | Matson | |
| 5,116,650 A * | 5/1992 | Bowser | B01D 39/1623 162/168.1 |
| 5,156,780 A | 10/1992 | Kenigsberg et al. | |
| 5,215,554 A | 6/1993 | Kramer et al. | |
| 5,286,279 A | 2/1994 | Wu | |
| 5,356,459 A * | 10/1994 | Bikson | B01D 53/22 55/524 |
| 5,554,414 A | 9/1996 | Moya et al. | |
| 5,700,375 A | 12/1997 | Hagen et al. | |
| 5,753,014 A * | 5/1998 | Van Rijn | B01D 39/1692 55/524 |
| 5,828,012 A * | 10/1998 | Repolle | H04R 1/023 181/175 |
| 5,955,175 A | 9/1999 | Culler | |
| 6,015,500 A | 1/2000 | Zuk | |
| 6,375,854 B2 | 4/2002 | Beplate | |
| 6,512,834 B1 | 1/2003 | Banter et al. | |
| 6,550,622 B2 | 4/2003 | Koslow | |
| 6,932,187 B2 | 8/2005 | Banter et al. | |
| 7,255,725 B2 | 8/2007 | Chau et al. | |
| 8,079,574 B2 | 12/2011 | Lin | |
| 8,523,981 B2 | 9/2013 | Huang et al. | |
| 8,747,521 B2 | 6/2014 | Sano | |
| 9,005,334 B2 * | 4/2015 | Furuyama | B01D 46/54 95/43 |
| 9,044,706 B2 * | 6/2015 | Furuyama | B01D 39/1692 |
| 9,171,535 B2 * | 10/2015 | Abe | G10K 11/002 |
| 2002/0076534 A1 * | 6/2002 | Sadato | A41D 31/0016 428/206 |
| 2002/0144595 A1 | 10/2002 | Wang et al. | |
| 2004/0081588 A1 * | 4/2004 | Hammerstedt | A01N 1/02 422/550 |
| 2005/0076779 A1 * | 4/2005 | Saijo | B01D 53/22 96/11 |
| 2006/0147698 A1 | 7/2006 | Carroll et al. | |
| 2007/0029256 A1 * | 2/2007 | Nakano | A61M 1/3633 210/641 |
| 2008/0134884 A1 * | 6/2008 | Sammons | B01D 53/22 95/45 |
| 2008/0156722 A1 * | 7/2008 | Suzuki | B01D 67/0011 210/500.36 |
| 2008/0160374 A1 * | 7/2008 | Takagi | B01D 53/228 429/492 |
| 2008/0314820 A1 | 12/2008 | Prulhiere et al. | |
| 2009/0268928 A1 | 10/2009 | Ikeyama et al. | |
| 2010/0024898 A1 | 2/2010 | Bansal et al. | |
| 2010/0178483 A1 * | 7/2010 | Masuda | C08J 5/18 428/220 |
| 2010/0206660 A1 | 8/2010 | Horie et al. | |
| 2011/0209265 A1 | 9/2011 | Komada et al. | |
| 2012/0114902 A1 * | 5/2012 | Furuyama | H05K 5/0213 428/137 |
| 2012/0171596 A1 * | 7/2012 | Hilliard | C25B 9/10 429/482 |
| 2012/0297976 A1 | 11/2012 | Sano | |
| 2013/0087042 A1 * | 4/2013 | Furuyama | B01D 39/1692 95/47 |
| 2013/0192460 A1 | 8/2013 | Miller et al. | |
| 2013/0296825 A1 | 11/2013 | Lerner | |
| 2013/0333978 A1 * | 12/2013 | Abe | G10K 11/002 181/291 |
| 2014/0038171 A1 | 2/2014 | Metzger | |
| 2015/0246319 A1 * | 9/2015 | Furuyama | B01D 39/1692 55/486 |
| 2015/0304767 A1 * | 10/2015 | Mori | H04M 1/03 381/334 |

FOREIGN PATENT DOCUMENTS

| | | |
|---|---|---|
| EP | 2305458 | 4/2011 |
| JP | 57-160617 | 10/1982 |
| JP | 60-038723 U | 3/1985 |
| JP | 6426655 | 1/1989 |
| JP | 2-167700 | 6/1990 |
| JP | 4012243 | 1/1992 |
| JP | 4-154573 | 5/1992 |
| JP | 4-506982 | 12/1992 |
| JP | 5-086216 | 4/1993 |
| JP | 9-132667 | 5/1997 |
| JP | 2002-035558 | 2/2002 |
| JP | 2003503991 | 1/2003 |
| JP | 2005-179562 | 7/2005 |
| JP | 2005-250268 | 9/2005 |
| JP | 2005-266004 | 9/2005 |
| JP | 2006-075648 | 3/2006 |
| JP | 2008-023469 | 2/2008 |
| JP | 2008-237949 | 10/2008 |
| JP | 2009-007439 | 1/2009 |
| JP | 2009-051872 | 3/2009 |
| JP | 2010070874 | 4/2010 |
| WO | 91/01791 | 2/1991 |
| WO | 0103468 | 1/2001 |
| WO | 2009154307 | 12/2009 |

OTHER PUBLICATIONS

Translation of Yasunori Andoh, et al. JP 60038723, 10 pgs, 1985.*
Office Action issued for Japanese patent application No. 2015-089021, dated Nov. 24, 2015, 7 pages including English translation.
Office Action issued for Japanese patent application No. 2011-274086, dated Jun. 2, 2015, 9 pages. including English translation.
Extended European Search Report for European Application No. 11795316.6, dated Sep. 5, 2016, 8 pages.

(56) References Cited

OTHER PUBLICATIONS

Extended European Search Report for European Patent Application No. 11795317.4, dated Feb. 2, 2017, 10 pages.

* cited by examiner

WATER-PROOF AIR-PERMEABLE FILTER AND USE OF THE SAME

TECHNICAL FIELD

The present invention relates to a water-proof air-permeable filter to be attached to, for example, a housing, and relates to use of the water-proof air-permeable filter.

BACKGROUND ART

Conventionally, in, for example, automobile electric components such as automobile ECUs (Electrical Control Units), motors, lamps, and sensors, household electric appliances such as electric toothbrushes, shavers, and cellular phones, and solar cells, an opening is provided in a housing that accommodates an electronic component, a control board, etc., in order to eliminate a pressure difference between the inside and outside of the housing, and the opening is covered with a water-proof air-permeable filter. This water-proof air-permeable filter ensures ventilation between the inside and outside of the housing and also prevents foreign matters such as water and dust from entering the housing.

For such a water-proof air-permeable filter, a polytetrafluoroethylene (PTFE) porous membrane having favorable air permeability and high water pressure resistance is commonly used (for example, see Patent Literature 1). Generally, a PTFE porous membrane can be obtained by molding PTFE fine powder into a sheet shape and then stretching the sheet-shaped molded body in two directions orthogonal to each other.

CITATION LIST

Patent Literature

PTL 1: JP 2008-237949 A

SUMMARY OF INVENTION

Technical Problem

A PTFE porous membrane has an intricate porous structure composed of fibrils and nodes, and also has non-uniform pore diameters. Therefore, a water-proof air-permeable filter using a PTFE porous membrane has variation in air permeability, and when the degree of air permeation is measured, the degree of air permeation varies depending on the parts of the water-proof air-permeable filter. Accordingly, measures, such as increasing the area of the water-proof air-permeable filter, are taken in some cases to achieve stable quality of the water-proof air-permeable filter.

In view of the above circumstances, an object of the present invention is to provide a water-proof air-permeable filter that has stable air permeability, and use of the water-proof air-permeable filter.

Solution to Problem

In order to solve the above problem, the present invention provides a water-proof air-permeable filter for ensuring ventilation and also preventing entry of water, the water-proof air-permeable filter comprising: a non-porous resin film having formed therein a plurality of through pores extending through the resin film in a thickness direction; and a treated layer having hydrophobicity and oil repellency, and formed on at least one of both surfaces in the thickness direction of the resin film such that the treated layer has openings at positions corresponding to the plurality of through pores. The plurality of through pores each have a predetermined size larger than or equal to 0.01 µm and smaller than or equal to 10 µm, and are uniformly distributed such that a density of the plurality of through pores falls within specific limits included in a range from 10 to $1\times10^8$ pores/mm$^2$.

Here, the "size" of the through pore means the diameter of a circle having an area equal to the cross-sectional area of the through pore.

In addition, the present invention provides use of a water-proof air-permeable filter, the use comprising using the above-described water-proof air-permeable filter to cover an opening provided in a housing, and eliminate a pressure difference between the inside and outside of the housing via the water-proof air-permeable filter.

Advantageous Effects of Invention

With the above features, ventilation is allowed by the through pores formed in the resin film, and waterproofness can also be ensured by the treated layer on the resin film. Furthermore, since the through pores each have the predetermined size and are uniformly distributed, air permeability can be evenly imparted to the entire water-proof air-permeable filter.

DESCRIPTION OF EMBODIMENT

Hereinafter, an embodiment of the present invention will be described with reference to the accompanying drawings.

Figure 1:
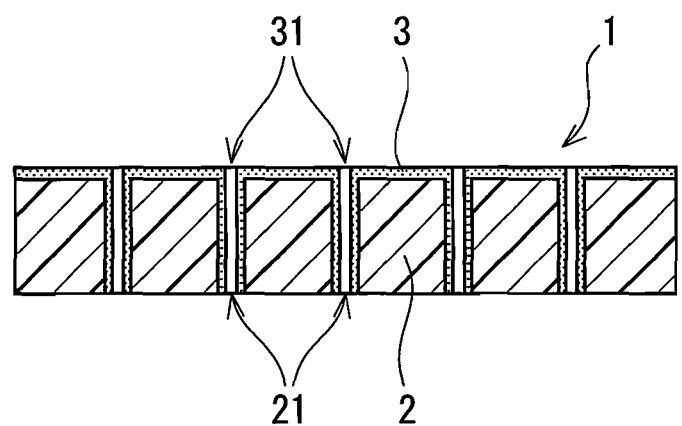
FIG. 1 is a schematic cross-sectional view of a water-proof air-permeable filter according to one embodiment of the present invention.

FIG. 1 shows a water-proof air-permeable filter 1 according to an embodiment of the present invention. The water-proof air-permeable filter 1 is for ensuring ventilation and also preventing entry of water. For example, the water-proof air-permeable filter 1 is attached to a housing (not shown) so as to cover an opening provided in the housing, and is used for eliminating a pressure difference between the inside and outside of the housing via the water-proof air-permeable filter 1.

Specifically, the water-proof air-permeable filter 1 includes a non-porous resin film 2 and a treated layer 3 formed on the resin film 2. As used herein, the term "non-porous" means having a solid inside that is filled with a resin.

In the resin film 2, a plurality of through pores 21 extending through the resin film 2 in the thickness direction are formed. In other words, the through pores 21 are open at both surfaces in the thickness direction of the resin film 2. Typically, the through pores 21 are straight pores having a given cross-sectional shape and extending linearly through the resin film 2. Such through pores can be formed by, for example, ion beam irradiation and etching. By use of ion beam irradiation and etching, through pores that have uniform sizes and axial directions can be formed in the resin film 2.

The cross-sectional shape of the through pores 21 is not particularly limited, and may be circular, or may be an undefined shape. In addition, the axial directions of the through pores 21 need not be a direction perpendicular to both surfaces in the thickness direction of the resin film 2, and may tilt relative to the direction.

The through pores 21 each have a predetermined size greater than or equal to 0.01 µm and smaller than or equal to 10 µm. The sizes of the through pores 21 need not be exactly the same among all the through pores 21, and it is sufficient that the through pores 21 have such sizes as can be considered to be substantially the same among all the through pores 21 (for example, the standard deviation is 10% or less of the average value). The sizes of the through pores 21 can be adjusted by etching time or the concentration of an etching treatment liquid. Preferably, the size of each through pore 21 is 0.5 µm or more and 5 µm or less.

In addition, the through pores 21 are uniformly distributed over the entire resin film 2 such that the density of the through pores 21 falls within specific limits included in a range from 10 to $1\times10^8$ pores/mm$^2$ (for example, such that the maximum density is smaller than or equal to 1.5 times of the minimum density). The density of the through pores 21 can be adjusted by the amount of ion irradiation at the time of ion beam irradiation. Preferably, the density of the through pores 21 is $1\times10^3$ to $1\times10^7$ pores/mm$^2$.

The porosity of the resin film 2 (the proportion of the sum of the cross-sectional areas of all the through pores 21 to the area defined by the outline of the resin film 2) is not particularly limited. In view of ensuring a film strength sufficient for the intended use, the porosity is preferably 50% or less, and more preferably 35% or less.

In addition, the thickness of the resin film 2 is not particularly limited. In order to realize a structure that has small pore diameters (high water pressure resistance) and a high porosity (high air permeability) (in order to form pores of small diameters even when a thick base material is used), the ratio of the thickness of the resin film 2 to the predetermined size (T/D when the predetermined size is defined as D and the thickness of the resin film is defined as T) is preferably 1 or more and 10000 or less, and more preferably 5 or more and 1000 or less.

The material of the resin film 2 is not particularly limited. Resins that can be decomposed by an alkali solution, an oxidant solution, or an alkali solution containing an oxidant are preferred. For example, the resin film 2 is made of at least one resin selected from polyethylene terephthalate (PET), polycarbonate (PC), polyimide (PI), polyethylene naphthalate (PEN), and polyvinylidene fluoride (PVdF).

An etching treatment liquid such as an alkali solution and an oxidant solution, which is appropriate for the material of the resin film 2, is used for the aforementioned etching for forming the through pores 21. For example, alkali solutions, such as potassium hydroxide and sodium hydroxide, can be used as a solution for hydrolyzing the resin. In addition, for example, oxidant solutions, such as a chlorous acid aqueous solution, a hypochlorous acid aqueous solution, a hydrogen peroxide solution, and a potassium permanganate solution, can be used as a solution for oxidatively decomposing the resin. For example, when the resin film 2 is formed of any of PET, PEN, and PC, a solution containing sodium hydroxide as the main component is used as the etching treatment liquid, and when the resin film 2 is formed of PI, a solution containing sodium hypochlorite as the main component is used as the etching treatment liquid. Furthermore, when the resin film 2 is formed of PVdF, a solution obtained by adding potassium permanganate to a solution containing sodium hydroxide as the main component is used as the etching treatment liquid to decompose PVdF.

Alternatively, a membrane filter sold by Oxyphen AG or Millipore Corporation can be used as the resin film 2 in which the through pores 21 are formed.

The resin film 2 may not necessarily consist of a single layer, and may consist of a plurality of separate layers.

In FIG. 1, the treated layer 3 is formed on one of both surfaces in the thickness direction of the resin film 2. However, the treated layer 3 may be formed on both surfaces of the resin film 2. That is, it is sufficient that the treated layer 3 is formed on at least one of both surfaces in the thickness direction of the resin film 2.

Specifically, the treated layer 3 is formed in such a manner as to have openings 31 at positions corresponding to the through pores 21, and has hydrophobicity and oil repellency. Such a treated layer 3 can be formed by applying a hydrophobic oil repellent agent thinly onto the resin film 2 and drying the agent. Examples of such an oil repellent agent include fluorine-based coating agents having a perfluoroalkyl group. The thickness of the treated layer 3 is preferably smaller than half of the above-described predetermined size of the through pores 21.

If an oil repellent agent is applied and dried on the resin film 2 in which the through pores 21 are formed as described above, the inner circumferential surfaces of the through pores 21 can also be coated with a second treated layer continuous with the treated layer 3. In this case, the sizes of the openings 31 of the treated layer 3 are smaller than the sizes of the through pores 21 by the thickness of the second treated layer.

Figure 2:
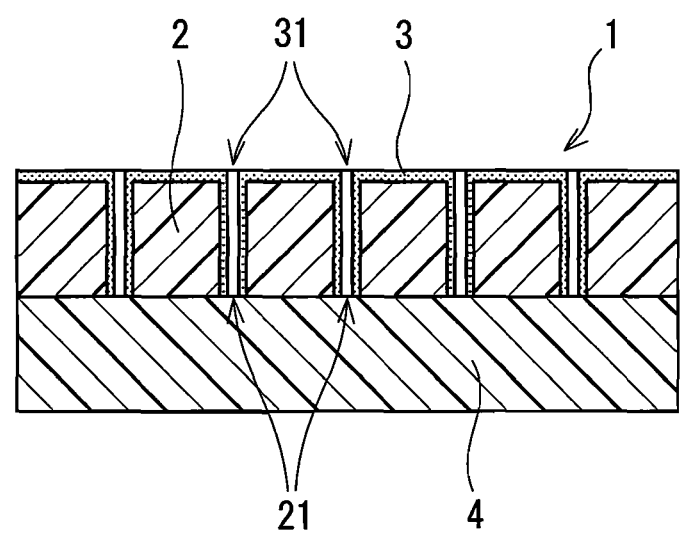
FIG. 2 is a schematic cross-sectional view of a water-proof air-permeable filter according to another embodiment of the present invention.

For example, as shown in FIG. 2, an air-permeable supporting member 4 may be laminated to the resin film 2. The air-permeable supporting member 4 may be laminated to the surface of the resin film 2 on which the treated layer 3 is not formed as shown in FIG. 2, or may be laminated to the surface of the resin film 2 on which the treated layer 3 is formed, with the treated layer 3 interposed therebetween. In addition, the air-permeable supporting member 4 may be laminated not only to one surface of the resin film 2 but also to the other surface. The air-permeable supporting member 4 preferably has better air permeability than the resin film 2. For example, a woven fabric, a nonwoven fabric, a net, a mesh, or the like, can be used as the air-permeable supporting member 4. In addition, examples of the material of the air-permeable supporting member 4 include polyester, polyethylene, and aramid resins.

The resin film 2 and the air-permeable supporting member 4 are joined by a common method such as heat welding and bonding using an adhesive agent. The resin film 2 and the air-permeable supporting member 4 are partially joined, and the area of the joined parts is preferably 5 to 20% of the entire area. This is because when the area of the joined parts is less than 5% of the entire area, the resin film 2 and the air-permeable supporting member 4 are likely to separate from each other, whereas when the area of the joined parts is more than 20%, the water pressure resistance at the joined parts is reduced. Preferably, the joined parts are distributed evenly over the entire area.

The water pressure resistance of the water-proof air-permeable filter 1 having the above features, which is measured in accordance with JIS L1092-A (low water pressure method) or JIS L1092-B (high water pressure method), is preferably 1 kPa or more and 1000 kPa or less.

The water-proof air-permeable filter 1 of the present embodiment allows ventilation by the through pores 21 formed in the resin film 2, and can also ensure waterproofness by the treated layer 3 on the resin film 2. Furthermore, since the through pores 21 each have the predetermined size and are uniformly distributed, air permeability can be evenly imparted to the entire water-proof air-permeable filter 1.

In conventional water-proof air-permeable filters using PTFE porous membranes, a plurality of PTFE porous membranes are laminated in order to increase the thickness in some cases. In this case, water may leak from an interface between the PTFE porous membranes during pressure resistance test due to a pressure lower than the water pressure that each single PTFE porous membrane can withstand. By contrast, in the case of the water-proof air-permeable film 1 of the present embodiment, it is sufficient to use a thick resin film 2 in order to increase the thickness. Accordingly, no problem occurs during water pressure resistance test. In order to form the through pores 21 in the thick resin film 2, it is sufficient to irradiate the resin film 2 with heavy ions at a high acceleration and a high density at the time of ion beam irradiation.

Furthermore, since PTFE porous membranes are made porous by stretching, a water-proof air-permeable filter using a PTFE porous membrane has a low tensile strength. By contrast, the water-proof air-permeable filter 1 of the present embodiment is not stretched, and thus has a high tensile strength. That is, according to the water-proof air-permeable filter 1 of the present embodiment, improvement in processability and resistance against external force can be expected.

In addition, with the features of the present embodiment, when the air-permeable supporting member 4 is used, the resin film 2 that is made of the same material as the air-permeable supporting member 4 can be used. Therefore, for example, the adhesion between the air-permeable supporting member 4 and the resin film 2 can be enhanced by improving compatibility at the time of thermal lamination.

EXAMPLES

Hereinafter, the present invention will be described in detail using examples. However, the present invention is not restricted by the examples to any degree.

Example 1

A sample A of 22 μm thickness (Oxydisk manufactured by Oxyphen AG), which is produced by forming circular through pores with a diameter of 0.8 μm in a non-porous base sheet of PET by means of ion beam irradiation and etching, was used as a resin film.

The degree of air permeation of the sample A was measured at 20 spots in accordance with JIS P8117. The result showed that the degree of air permeation (Gurley number) of the sample A was 2.7 seconds/100 mL on average, and the standard deviation was 0.169 seconds/100 mL.

In addition, a microscope photograph of one surface of the sample A was taken, and the density of the through pores in the sample A was measured at 10 spots by counting the number of pores per given area. The result showed that the density of the through pores was $3.6 \times 10^5$ to $5.5 \times 10^5$ pores/$mm^2$.

A nonwoven fabric made of PET was laminated as an air-permeable supporting member to one surface of the sample A which is a resin film by heat welding, and then a fluorine-based treatment agent (X-70-029C manufactured by Shin-Etsu Chemical Co., Ltd.) was applied to the other surface of the resin film and was dried, to form a treated layer having hydrophobicity and oil repellency. The thickness of the treated layer was 0.1 μm. In the above manner, a water-proof air permeable filter was obtained.

Example 2

A water-proof air-permeable filter was obtained in the same manner as in Example 1 except that a sample B of 20 μm thickness (Oxydisk manufactured by Oxyphen AG), which is produced by forming through pores with a diameter of 3.0 μm in a non-porous base sheet of PET by means of ion beam irradiation and etching, was used as a resin film.

The degree of air permeation of the sample B was measured at 20 spots in accordance with JIS P8117. The result showed that the degree of air permeation (Gurley number) of the sample B was 1.1 seconds/100 mL on average, and the standard deviation was 0.035 seconds/100 mL.

In addition, a microscope photograph of one surface of the sample B was taken, and the density of the through pores in the sample B was measured at 10 spots by counting the number of pores per given area. The result showed that the density of the through pores was $7.0 \times 10^3$ to $9.5 \times 10^3$ pores/$mm^2$.

Comparative Example 1

A water-proof air-permeable filter was obtained in the same manner as in Example 1 except that a PTFE porous membrane A having a thickness of 20 μm and an average pore diameter of 0.5 μm was used instead of a resin film. The PTFE porous membrane A was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 5 in the longitudinal direction and by a factor of 8 in the lateral direction at 380° C. which is higher than or equal to the melting point of PTFE.

The degree of air permeation of the PTFE porous membrane A was measured at 20 spots in accordance with JIS P8117. The result showed that the degree of air permeation (Gurley number) of the PTFE porous membrane A was 11.9 seconds/100 mL on average, and the standard deviation was 3.450 seconds/100 mL.

Comparative Example 2

A water-proof air-permeable filter was obtained in the same manner as in Example 1 except that a PTFE porous membrane B having a thickness of 20 μm and an average pore diameter of 0.8 μm was used instead of a resin film. The PTFE porous membrane B was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 4.5 in the longitudinal direction and by a factor of 15 in the lateral direction at 280° C. which is lower than or equal to the melting point of PTFE.

The degree of air permeation of the PTFE porous membrane B was measured at 20 spots in accordance with JIS P8117. The result showed that the degree of air permeation (Gurley number) of the PTFE porous membrane A was 1.1 seconds/100 mL on average, and the standard deviation was 0.167 seconds/100 mL.

Comparative Example 3

A water-proof air-permeable filter was obtained in the same manner as in Example 1 except that a PTFE porous membrane C having a thickness of 70 μm and an average pore diameter of 3.0 μm was used instead of a resin film. The PTFE porous membrane C was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 10 in the longitudinal direction and by a factor of 8 in the lateral direction at 380° C. which is higher than or equal to the melting point of PTFE.

The degree of air permeation of the PTFE porous membrane C was measured at 20 spots in accordance with JIS P8117. The result showed that the degree of air permeation (Gurley number) of the PTFE porous membrane C was 1.7 seconds/100 mL on average, and the standard deviation was 0.263 seconds/100 mL.

(Test)

The degree of air permeation of each of the water-proof air-permeable filters of Examples and Comparative Examples was measured at 20 spots in accordance with JIS P8117, and the average value and the standard deviation were calculated. Furthermore, the standard deviation was divided by the average value, and the resultant value was multiplied by 100 to calculate the degree of variability.

In addition, the water pressure resistance of each of the water-proof air-permeable filters of Examples and Comparative Examples was measured in accordance with JIS L1092. The results are shown in Table 1.

TABLE 1

| | Degree of air permeation | | | Water pressure resistance (kPa) | (Average) pore diameter (μm) |
|---|---|---|---|---|---|
| | Average value (sec/100 mL) | Standard deviation (sec/100 mL) | Degree of variability (%) | | |
| Example 1 | 3.7 | 0.284 | 7.7 | 120 | 0.8 |
| Example 2 | 1.5 | 0.059 | 3.8 | 20 | 3.0 |
| Com. Example 1 | 41.7 | 11.287 | 27.1 | 250 | 0.5 |
| Com. Example 2 | 5.9 | 1.131 | 19.2 | 140 | 0.8 |
| Com. Example 3 | 2.6 | 0.421 | 16.5 | 30 | 3.0 |

It is understood from Table 1 that the water-proof air-permeable filters of Examples, for which resin films having formed therein through pores were used, have a smaller degree of variability than that of the water-proof air-permeable filters of Comparative Examples for which PTFE porous membranes were used. Furthermore, the water-proof air-permeable filters of Examples also have higher water pressure resistance.

INDUSTRIAL APPLICABILITY

The water-proof air-permeable filter of the present invention is applicable to, for example, outdoor lamps such as outside lights, and lamps for electric trains etc., as well as automobile electric components, household electric appliances, and solar cells.

The invention claimed is:

1. A water-proof air-permeable filter for ensuring ventilation and also preventing entry of water, the water-proof air-permeable filter comprising:
   a non-porous resin film having opposed first and second surfaces spaced from each other in a thickness direction, the resin film having formed therein a plurality of through pores extending through the resin film in the thickness direction of the resin film; and
   a treated layer having hydrophobicity and oil repellency, and formed on at least one of the first and second surfaces of the resin film such that the treated layer has openings at positions corresponding to the plurality of through pores,
   wherein a ratio of a standard deviation of a size of the through pores relative to an average of the size of the through pores is 10% or less.

2. The water-proof air-permeable filter according to claim 1,
   wherein the treated layer coats an inner surface of the through pores so as to form an inner part of the treated layer located inside the through pores.

3. The water-proof air-permeable filter according to claim 2,
   wherein the plurality of the through pores are a plurality of straight pores.

4. The water-proof air-permeable filter according to claim 1,
   wherein a material forming the treated layer is different from a material forming the resin film.

5. The water-proof air-permeable filter according to claim 1,
   wherein the plurality of the through pores are a plurality of straight pores,
   the treated layer coats an inner surface of the through pores so as to form an inner part of the treated layer located inside the through pores,
   the inner part extends from the first surface to the second surface, and
   air passages extending through the resin film are formed in the inner part.

6. A water-proof air-permeable filter for ensuring ventilation and also preventing entry of water, the water-proof air-permeable filter comprising:
   a non-porous resin film having opposed first and second surfaces spaced from each other in a thickness direction, the resin film having formed therein a plurality of through pores extending through the resin film in the thickness direction of the resin film; and
   a treated layer having hydrophobicity and oil repellency, and formed on at least one of the first and second surfaces of the resin film such that the treated layer has openings at positions corresponding to the plurality of through pores,
   wherein a degree of variability of air permeation of the water-proof air-permeable filter is 7.7% or less, the degree of variability being obtained by measuring a degree of air permeation of the water-proof air-permeable filter at 20 spots in accordance with JIS P8117, calculating an average value of the 20 measurements and a standard deviation of the 20 measurements, dividing the standard deviation by the average value to calculate a resultant value, and multiplying the resultant value by 100 to calculate the degree of variability.

7. The water-proof air-permeable filter according to claim 6,
wherein the treated layer coats an inner surface of the through pores so as to form an inner part of the treated layer located inside the through pores.

8. The water-proof air-permeable filter according to claim 7, wherein the plurality of the through pores are a plurality of straight pores.

9. The water-proof air-permeable filter according to claim 6,
wherein a material forming the treated layer is different from a material forming the resin film.

10. The water-proof air-permeable filter according to claim 6,
wherein the plurality of the through pores are a plurality of straight pores,
the treated layer coats an inner surface of the through pores so as to form an inner part of the treated layer located inside the through pores,
the inner part extends from the first surface to the second surface, and
air passages extending through the resin film are formed in the inner part.

11. A water-proof air-permeable filter for ensuring ventilation and also preventing entry of water, the water-proof air-permeable filter comprising:
a non-porous resin film having opposed first and second surfaces spaced from each other in a thickness direction, the resin film having formed therein a plurality of through pores extending through the resin film in the thickness direction of the resin film; and
a treated layer having hydrophobicity and oil repellency, and formed on at least one of the first and second surfaces of the resin film such that the treated layer has openings at positions corresponding to the plurality of through pores,
wherein an average value of a degree of air permeation of the water-proof air-permeable filter is 3.7 seconds/100 mL or less, the average value being obtained by measuring a degree of air permeation of the water-proof air-permeable filter at 20 spots in accordance with JIS P8117, and averaging the 20 measurements to calculate the average value.

12. The water-proof air-permeable filter according to claim 11,
wherein the treated layer coats an inner surface of the through pores so as to form an inner part of the treated layer located inside the through pores.

13. The water-proof air-permeable filter according to claim 12, wherein the plurality of the through pores are a plurality of straight pores.

14. The water-proof air-permeable filter according to claim 11,
wherein a material forming the treated layer is different from a material forming the resin film.

15. The water-proof air-permeable filter according to claim 11,
wherein a standard deviation of the air permeation of the water-proof air-permeable filter is 0.284 sec/100 mL or less, the standard deviation of the air permeation being obtained by measuring the degree of the air permeation of the water-proof air-permeable filter at 20 spots in accordance with JIS P8117, and calculating a standard deviation of the 20 measurements to obtain the standard deviation of the air permeation.

16. The water-proof air-permeable filter according to claim 11,
wherein the plurality of the through pores are a plurality of straight pores,
the treated layer coats an inner surface of the through pores so as to form an inner part of the treated layer located inside the through pores,
the inner part extends from the first surface to the second surface, and
air passages extending through the resin film are formed in the inner part.

17. A method for producing a water-proof air-permeable filter, the method comprising steps of:
forming a plurality of through pores in a non-porous resin film by irradiation of ion beam and etching with an etching treatment liquid; and
applying a hydrophobic oil repellent agent onto the non-porous resin film having therein the plurality of the through pores,
wherein the plurality of the through pores are a plurality of straight pores, and
the hydrophobic oil repellent agent is applied so as to coat an inner surface of the plurality of the through pores in the step of applying the hydrophobic oil repellent agent.

18. The method for producing a water-proof air-permeable filter according to claim 17,
wherein the inner surface is a surface that has been subjected to the etching with the etching treatment liquid.

19. The method for producing a water-proof air-permeable filter according to claim 17, wherein
the resin film has opposed first and second surfaces spaced from each other in a thickness direction, and
an area of the inner surface to which the hydrophobic oil repellent agent is applied extends from the first surface to the second surface so that a treated layer having hydrophobicity and oil repellency coats the inner surface so as to form an inner part of the treated layer located inside the through pores, the inner part extends from the first surface to the second surface, and air passages extending through the resin film are formed in the inner part.

* * * * *